United States Patent
Buchtmann et al.

(10) Patent No.: US 7,913,402 B2
(45) Date of Patent: *Mar. 29, 2011

(54) COATING FOR CUTTING IMPLEMENTS

(75) Inventors: Larry Buchtmann, Goldsboro, NC (US); Gary Pia, Stratford, CT (US)

(73) Assignee: Acme United Corporation, Fairfield, CT (US)

( * ) Notice: Subject to any disclaimer, the term of this patent is extended or adjusted under 35 U.S.C. 154(b) by 84 days.

This patent is subject to a terminal disclaimer.

(21) Appl. No.: 11/231,151

(22) Filed: Sep. 20, 2005

(65) Prior Publication Data

US 2007/0186421 A1 Aug. 16, 2007

Related U.S. Application Data

(63) Continuation-in-part of application No. 10/720,578, filed on Nov. 24, 2003, now Pat. No. 6,988,318, which is a continuation of application No. PCT/US02/36314, filed on Nov. 13, 2002, and a continuation-in-part of application No. 29/213,571, filed on Sep. 20, 2004, now Pat. No. Des. 526,879, and a continuation-in-part of application No. 10/695,429, filed on Oct. 28, 2003.

(60) Provisional application No. 60/338,575, filed on Nov. 13, 2001, provisional application No. 60/421,581, filed on Oct. 28, 2002.

(51) Int. Cl.
*B26B 9/00* (2006.01)
(52) U.S. Cl. .............. 30/350; 30/346; 428/457
(58) Field of Classification Search .............. 30/346, 30/350; 76/104.1; 428/457
See application file for complete search history.

(56) References Cited

U.S. PATENT DOCUMENTS

| 437,468 | A | 9/1890 | Wheeler |
| 1,740,395 | A | 12/1929 | Durst |
| 1,941,215 | A | 12/1933 | Liggo |
| 2,103,217 | A | 12/1937 | Ford |
| 2,214,890 | A | 9/1940 | Rhodes, Jr. |
| 2,270,473 | A | 1/1942 | Porcelli |
| 2,408,767 | A | 10/1946 | Fleming |
| 2,561,438 | A | 7/1951 | Duchesneau |
| 2,822,781 | A | 2/1958 | Burton |

(Continued)

FOREIGN PATENT DOCUMENTS

DE 34 47 962 11/1985

(Continued)

OTHER PUBLICATIONS

Modern Machine Shop, Multiple Layer Coatings Keep Microcracks from Destroying Inserts, posted on Jan. 15, 2008, http://www.mmsonline.com/articles/multiple-layer-coatings-keep-microcracks-from-destr...; printed Nov. 21, 2008.

(Continued)

*Primary Examiner* — Hwei-Siu C Payer
(74) *Attorney, Agent, or Firm* — Alix, Yale & Ristas, LLP

(57) ABSTRACT

A cutting implement having a cutting blade and a coating is provided. The coating has titanium chromium nitride and provides the blade with a satin silver appearance. In some embodiments, the titanium chromium nitride coating has a thickness in a range between about 0.3 microns and 0.5 microns, a surface roughness in a range of about 15 to $25 \times 10^{-6}$ inch/inch, and a hardness in a range of about 5.7 to 9.1 gigapascals.

21 Claims, 9 Drawing Sheets

| Sample No. | Target Composition | Average Hardness (Gegapascals) | Hardness Range (Gegapascals) | Appearance |
|---|---|---|---|---|
| 1 | None | 5.9 | 5.4 - 6.3 | Medium gloss silver |
| 2 | 100% Ti | 7.0 | 5.8 - 7.2 | Satin gold |
| 3 | 75% Ti / 25% Cr | 7.3 | 5.8 - 8.8 | Satin gold |
| 4 | 50% Ti / 50% Cr | 7.4 | 7.2 - 7.6 | Satin silver |
| 5 | 25% Ti / 75% Cr | 7.4 | 5.7 - 9.1 | Satin silver |
| 6 | 100% Cr | 7.9 | 6.5 - 9.3 | Medium gloss silver |
| 7 | 90% Ti / 10% Cr | 6.5 | 6.1 - 6.9 | Satin gold |
| 8 | 60% Ti / 40% CR | 7.1 | 6.8 - 7.4 | Satin gold |
| 9 | 25% Ti / 75% Cr | 7.4 | 6.9 - 7.9 | Satin silver |
| 10 | 10% Ti / 90% Cr | 9.0 | 8.9 - 9.1 | Medium gloss silver |

* Shank formed of heat-treated 420 stainless steel in all samples.

U.S. PATENT DOCUMENTS

| | | |
|---|---|---|
| 3,004,522 A | 10/1961 | Kent |
| 3,106,910 A | 10/1963 | Lou |
| 3,175,539 A | 3/1965 | Saflund et al. |
| 3,467,843 A | 9/1969 | Dailey |
| 3,490,324 A | 1/1970 | Dahle |
| 3,595,285 A | 7/1971 | Ruben |
| 3,678,975 A | 7/1972 | Imanishi et al. |
| 3,776,286 A | 12/1973 | Blanck |
| 3,777,791 A | 12/1973 | Uchida |
| 3,792,636 A | 2/1974 | Pottern |
| 3,874,900 A | 4/1975 | Post et al. |
| 3,889,730 A | 6/1975 | Buc |
| 3,937,239 A | 2/1976 | Bosland |
| 3,988,955 A | 11/1976 | Engel et al. |
| 4,007,524 A | 2/1977 | Hannes et al. |
| 4,046,044 A | 9/1977 | Paterson et al. |
| 4,050,487 A | 9/1977 | Mabuchi et al. |
| 4,431,038 A | 2/1984 | Rome |
| 4,436,830 A | 3/1984 | Andreev et al. |
| 4,450,205 A | 5/1984 | Itaba et al. |
| 4,469,489 A | 9/1984 | Sarin |
| 4,470,895 A | 9/1984 | Coad et al. |
| 4,601,316 A | 7/1986 | Verdi |
| 4,670,172 A | 6/1987 | Sproul et al. |
| 4,685,366 A | 8/1987 | Beder |
| 4,698,266 A | 10/1987 | Buljan |
| 4,755,237 A | 7/1988 | Lemelson |
| 4,815,507 A | 3/1989 | O'Rourke |
| D305,248 S | 12/1989 | Ukisu |
| 4,892,792 A | 1/1990 | Sarin |
| D306,551 S | 3/1990 | Yuen |
| 4,933,058 A | 6/1990 | Bache et al. |
| D311,027 S | 10/1990 | Yuen |
| 4,966,208 A | 10/1990 | Uang |
| 4,981,756 A | 1/1991 | Rhandhawa |
| 4,984,492 A | 1/1991 | Gerber |
| 5,027,684 A | 7/1991 | Neukam |
| D320,812 S | 10/1991 | Yuen |
| 5,052,453 A | 10/1991 | Chen |
| D324,184 S | 2/1992 | Benech |
| D324,700 S | 3/1992 | Shimoo et al. |
| 5,120,596 A | 6/1992 | Yamada |
| 5,152,774 A | 10/1992 | Schroeder |
| 5,162,147 A | 11/1992 | Ruppi |
| D333,839 S | 3/1993 | Kiyokane |
| D335,308 S | 5/1993 | Shapiro et al. |
| D336,124 S | 6/1993 | Ordlock |
| 5,219,354 A | 6/1993 | Choudhury et al. |
| D339,536 S | 9/1993 | Ribron |
| 5,301,431 A | 4/1994 | Cera |
| 5,322,001 A | 6/1994 | Boda |
| D354,987 S | 1/1995 | Yuen |
| 5,379,817 A | 1/1995 | O'Neil et al. |
| 5,476,134 A | 12/1995 | Whittle et al. |
| 5,477,616 A | 12/1995 | Williams et al. |
| D367,618 S | 3/1996 | Stewart et al. |
| 5,525,420 A | 6/1996 | Kaufmann |
| 5,528,833 A | 6/1996 | Sakuma |
| 5,584,845 A | 12/1996 | Hart |
| D377,666 S | 1/1997 | Yuen |
| D378,834 S | 4/1997 | Yuen |
| D378,835 S | 4/1997 | Guerrero |
| D383,165 S | 9/1997 | Gstalder |
| D383,783 S | 9/1997 | Jeter et al. |
| 5,671,647 A | 9/1997 | Mori |
| D387,091 S | 12/1997 | Anderson |
| 5,700,094 A | 12/1997 | Dam |
| D388,828 S | 1/1998 | Robinson et al. |
| D390,264 S | 2/1998 | Singleton et al. |
| 5,724,868 A | 3/1998 | Knudsen et al. |
| 5,746,586 A | 5/1998 | Fukuhara |
| D396,062 S | 7/1998 | White et al. |
| D396,886 S | 8/1998 | de Melo et al. |
| D397,048 S | 8/1998 | Herndon |
| D402,314 S | 12/1998 | Lidle, Jr. et al. |
| D405,830 S | 2/1999 | Mak |
| D406,173 S | 2/1999 | Chen |
| 5,894,666 A | 4/1999 | Hrusch |
| D409,102 S | 5/1999 | Balliette |
| D412,344 S | 7/1999 | Clark |
| D417,238 S | 11/1999 | Huang |
| 5,983,507 A | 11/1999 | Hirai |
| D417,693 S | 12/1999 | Daley, Jr. |
| 5,996,459 A | 12/1999 | Cornell et al. |
| D418,874 S | 1/2000 | Shapiro |
| D420,390 S | 2/2000 | Donaldson |
| D422,313 S | 4/2000 | Chen |
| D423,585 S | 4/2000 | Chen |
| D425,560 S | 5/2000 | Yuen |
| 6,065,514 A | 5/2000 | New |
| D426,852 S | 6/2000 | Gstalder |
| 6,076,264 A | 6/2000 | Meckel |
| 6,098,515 A | 8/2000 | Daley, Jr. |
| D431,263 S | 9/2000 | Greenhouse |
| 6,189,218 B1 | 2/2001 | Okada |
| D441,796 S | 5/2001 | Chan |
| D442,993 S | 5/2001 | Eisen |
| 6,249,981 B1 | 6/2001 | Shu |
| D445,833 S | 7/2001 | Fonfeder |
| D449,072 S | 10/2001 | Bennett |
| 6,309,738 B1 | 10/2001 | Sakurai |
| D451,961 S | 12/2001 | Shapiro |
| 6,330,750 B1 | 12/2001 | Meckel |
| D453,188 S | 1/2002 | Fonfeder |
| D454,159 S | 3/2002 | Tsuchikura |
| 6,372,369 B1 | 4/2002 | Ito et al. |
| 6,391,457 B1 | 5/2002 | Wetty |
| D460,115 S | 7/2002 | Sawyer |
| D460,116 S | 7/2002 | Gstalder |
| 6,422,110 B1 | 7/2002 | Wurst et al. |
| D461,206 S | 8/2002 | Gstalder |
| 6,460,443 B1 | 10/2002 | Hsiao |
| 6,470,929 B2 | 10/2002 | Fregeolle |
| D466,940 S | 12/2002 | Gstalder |
| 6,492,011 B1 | 12/2002 | Brandle et al. |
| 6,497,772 B1 | 12/2002 | Meckel et al. |
| D469,809 S | 2/2003 | Gstalder |
| D470,182 S | 2/2003 | Gstalder |
| D470,183 S | 2/2003 | Gstalder |
| D470,889 S | 2/2003 | Daley, Jr. |
| 6,540,451 B1 | 4/2003 | Mori |
| 6,553,882 B1 | 4/2003 | Daley, Jr. et al. |
| D474,508 S | 5/2003 | Lammers et al. |
| 6,565,957 B2 | 5/2003 | Nakamura |
| D477,017 S | 7/2003 | Vossler et al. |
| D477,847 S | 7/2003 | Gosse |
| D480,110 S | 9/2003 | Lin |
| 6,617,057 B2 | 9/2003 | Gorokhovsky et al. |
| 6,637,481 B2 | 10/2003 | Mak et al. |
| 6,675,689 B2 | 1/2004 | Nunez et al. |
| D489,094 S | 4/2004 | Bodum |
| 6,730,392 B2 | 5/2004 | Vetter et al. |
| D494,222 S | 8/2004 | Berry |
| 6,845,795 B2 | 1/2005 | Lamers et al. |
| 6,866,921 B2 | 3/2005 | Grab et al. |
| 6,884,240 B1 * | 4/2005 | Dykes ............................. 606/1 |
| 6,886,614 B2 | 5/2005 | Ricono et al. |
| 6,929,851 B1 | 8/2005 | Leverenz et al. |
| 6,988,318 B2 | 1/2006 | Buchtmann et al. |
| 7,008,688 B2 | 3/2006 | Toihara |
| 7,037,587 B2 | 5/2006 | Lin |
| 7,140,113 B2 | 11/2006 | King et al. |
| 2002/0096031 A1 | 7/2002 | Yang |
| 2003/0070305 A1 | 4/2003 | Oshika et al. |
| 2003/0140757 A1 | 7/2003 | Carlson et al. |
| 2003/0140761 A1 | 7/2003 | Schulz |
| 2003/0154835 A1 | 8/2003 | Nunez et al. |
| 2004/0142205 A1 | 7/2004 | Chen |
| 2004/0168324 A1 | 9/2004 | Buchtmann et al. |
| 2004/0234704 A1 | 11/2004 | Garg |
| 2005/0255329 A1 | 11/2005 | Hazel et al. |
| 2006/0095060 A1 | 5/2006 | Mayenberger et al. |

FOREIGN PATENT DOCUMENTS

| | | |
|---|---|---|
| EP | 0095128 A1 | 11/1983 |
| EP | 0095130 A1 | 11/1983 |
| EP | 0095131 A1 | 11/1983 |

| | | |
|---|---|---|
| EP | 801144 A1 | 10/1997 |
| EP | 0846538 A2 | 6/1998 |
| JP | 62-181836 | 8/1987 |
| JP | 1047849 | 2/1989 |
| JP | 2080901 | 3/1990 |
| JP | 4-114689 | 4/1992 |
| JP | 5-68754 | 3/1993 |
| JP | 5-84363 | 4/1993 |
| JP | 5-146558 | 6/1993 |
| JP | 7268660 | 10/1995 |
| JP | 10168583 | 6/1998 |
| JP | 2005097651 | 4/2005 |
| WO | 9418354 A1 | 8/1994 |
| WO | 03041919 | 5/2003 |
| WO | 2005061410 A1 | 7/2005 |
| WO | 2007035807 A2 | 3/2007 |

OTHER PUBLICATIONS

Madorsky et al., Coating for stamping and forming tools, Mar. 8, 2005, http://www.thefabricatorcom/Printer_Friendly_Article.cfm?ID=1058, printed Nov. 21, 2008.

Tooling & Production, Coating Technology Takes Another Quantum Leap, http://www.manufacturingcenter.com/tooling/archives/0399/399quan.asp, printed Aug. 7, 2006.

Surviliene, et al., Surface & Coatings Technology, 176, 2004, pp. 193-201.

Zimmermann, Oberflachen -Polysurfaces No. 4, vol. 41, 2000, pp. 14-19.

Veprek, et al., Surface Engineering: Science and Technology I,The Minerals, Metals and Materials Society, 1999, pp. 219-231.

Chen, et al., Surface Engineering: Science and Technology I, The Minerals, Metals and Materials Society, 1999, pp. 379-384.

Lugscheider, et al., Surface Engineering: Science and Technology I, The Minerals, Metals and Materials Society, 1999, pp. 405-414.

Holleck, Surface Engineering: Science and Technology I, The Minerals, Metals and Materials Society, 1999, pp. 207-218.

Zhang, et al., Surface and Coatings Technology, 167, 2003, pp. 113-119.

Nonfinal Office Action mailed May 1, 2008 for U.S. Appl. No. 11/337,789, filed Jan. 23, 2006.

Final Office Action mailed May 21, 2009 for U.S. Appl. No. 11/337,789, filed Jan. 23, 2006.

Nonfinal Office Action mailed Dec. 28, 2006 for U.S. Appl. No. 11/337,976, filed Jan. 23, 2006.

Nonfinal Office Action mailed Oct. 16, 2007 for U.S. Appl. No. 11/337,976, filed Jan. 23, 2006.

Final Office Action mailed Jun. 27, 2008 for U.S. Appl. No. 11/337,976, filed Jan. 23, 2006.

Nonfinal Office Action mailed Jul. 3, 2008 for U.S. Appl. No. 11/231,259, filed Sep. 20, 2005.

Final Office Action mailed Mar. 11, 2009 for U.S. Appl. No. 11/231,259, filed Sep. 20, 2005.

Nonfinal Office Action mailed Dec. 29, 2008 for U.S. Appl. No. 11/557,806, filed Nov. 8, 2006.

Non-Final Office Action mailed Nov. 16, 2009 for U.S. Appl. 11/557,806, filed Nov. 8, 2006.

* cited by examiner

| Sample No. | Target Composition | Average Hardness (Gegapascals) | Hardness Range (Gegapascals) | Appearance |
|---|---|---|---|---|
| 1 | None | 5.9 | 5.4 - 6.3 | Medium gloss silver |
| 2 | 100% Ti | 7.0 | 5.8 - 7.2 | Satin gold |
| 3 | 75% Ti / 25% Cr | 7.3 | 5.8 - 8.8 | Satin gold |
| 4 | 50% Ti / 50% Cr | 7.4 | 7.2 - 7.6 | Satin silver |
| 5 | 25% Ti / 75% Cr | 7.4 | 5.7 - 9.1 | Satin silver |
| 6 | 100% Cr | 7.9 | 6.5 - 9.3 | Medium gloss silver |
| 7 | 90% Ti / 10% Cr | 6.5 | 6.1 - 6.9 | Satin gold |
| 8 | 60% Ti / 40% CR | 7.1 | 6.8 - 7.4 | Satin gold |
| 9 | 25% Ti / 75% Cr | 7.4 | 6.9 - 7.9 | Satin silver |
| 10 | 10% Ti / 90% Cr | 9.0 | 8.9 - 9.1 | Medium gloss silver |

* Shank formed of heat-treated 420 stainless steel in all samples.

COATING FOR CUTTING IMPLEMENTS

CROSS-REFERENCE TO RELATED APPLICATIONS

This is a continuation-in-part application that claims priority to U.S. application Ser. No. 10/720,578, filed Nov. 24, 2003, now U.S. Pat. No. 6,988,318, which is a continuation of PCT/US02/36314, filed Nov. 13, 2002, which claims priority to U.S. Provisional Application No. 60/338,575, filed Nov. 13, 2001, the entirety of which are incorporated by reference herein. This also is a continuation-in-part application that claims priority to U.S. Design application Ser. No. 29/213, 571, filed Sep. 20, 2004, now U.S. Pat. No. D. 526,879 the entirety of which is incorporated by reference herein. This also is a continuation-in-part application that claims priority to U.S. application Ser. No. 10/695,429, filed Oct. 28, 2003, which claims priority to U.S. Provisional Application No. 60/421,581, filed Oct. 28, 2002, the entirety of which are incorporated by reference herein. This application is related to and incorporates by reference a co-pending continuation application entitled "Method for Coating Cutting Implements," U.S. application Ser. No. 11/231,259, filed Sep. 20, 2005, which claims priority to U.S. application Ser. No. 10/720,578, filed Nov. 24, 2003, now U.S. Pat. No. 6,988, 318, which claims priority to application No. PCT/US02/36314, filed Nov. 13, 2002, which is a continuation of 60/338, 575, filed Nov. 13, 2001.

BACKGROUND OF THE INVENTION

1. Field of the Invention

The present invention is related to cutting implements such as knives, sharpeners, and paper trimmers. More particularly, the present invention is related to a coating for such cutting implements.

2. Description of Related Art

Substantial effort has been expended in improving the construction and operation of cutting implements for household and office use. Ever increasing demands have been placed on manufacturers of these products to increase the ease of use, wear resistance, and the ease with which the products can be cleaned, while maintaining a competitive price. For example, typical household and office knives and paper trimmers have been unable to achieve a long-lasting cutting edge that withstands the wide variety of products being cut, at a competitive price.

BRIEF SUMMARY OF THE INVENTION

It is an object of the present invention to provide a cutting implement having a coating.

It is a further object of the present invention to provide a cutting implement having a coating that provides one or more of improved wear resistance, increased hardness, pleasing appearance, reduced user effort, and increased stain resistance.

These and other objects of the present invention are provided by a cutting implement comprising a cutting blade and a coating. The coating comprises titanium chromium nitride, which provides the cutting blade with a satin silver appearance.

A cutting implement having a cutting blade and a titanium chromium nitride coating is also provided. The titanium chromium nitride coating is disposed on each of the cutting blades. The titanium chromium nitride coating has a thickness in a range between about 0.3 and 0.5 microns, a surface roughness in a range of about 15 to $25 \times 10^{-6}$ inch/inch, and a hardness in a range of about 5.7 to about 9.1 gigapascals.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIG. 5 is a data table of testing results of various exemplary embodiments of a coating of the present invention for the scissors of FIG. 1;

Figure 1:
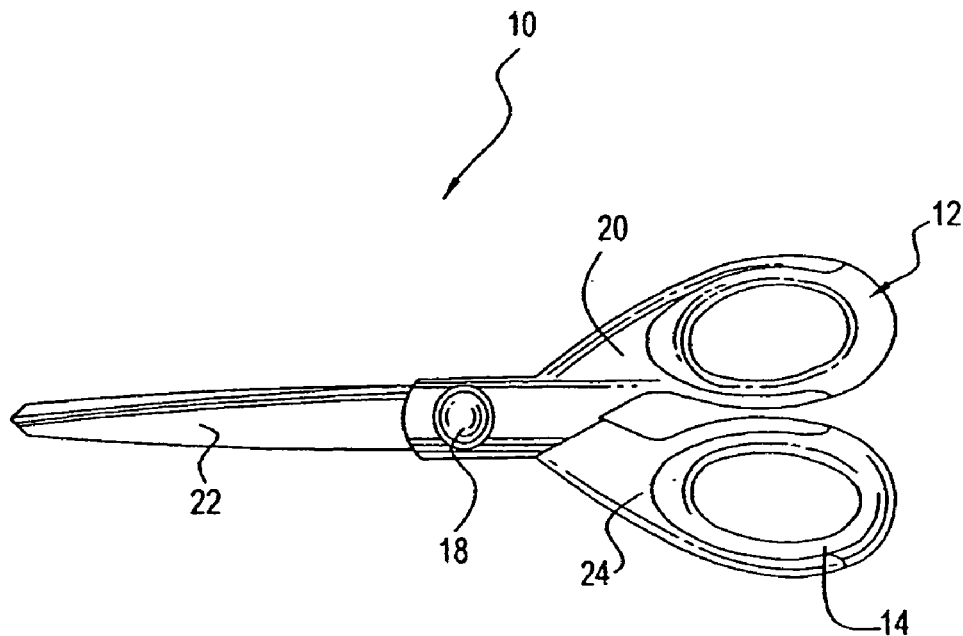
FIG. 1 is a first side view of an exemplary embodiment of a pair of scissors according to the present invention.

The invention is not limited in its application to the details of construction and the arrangement of the components set forth in the following description or illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION OF THE INVENTION

Figure 2:
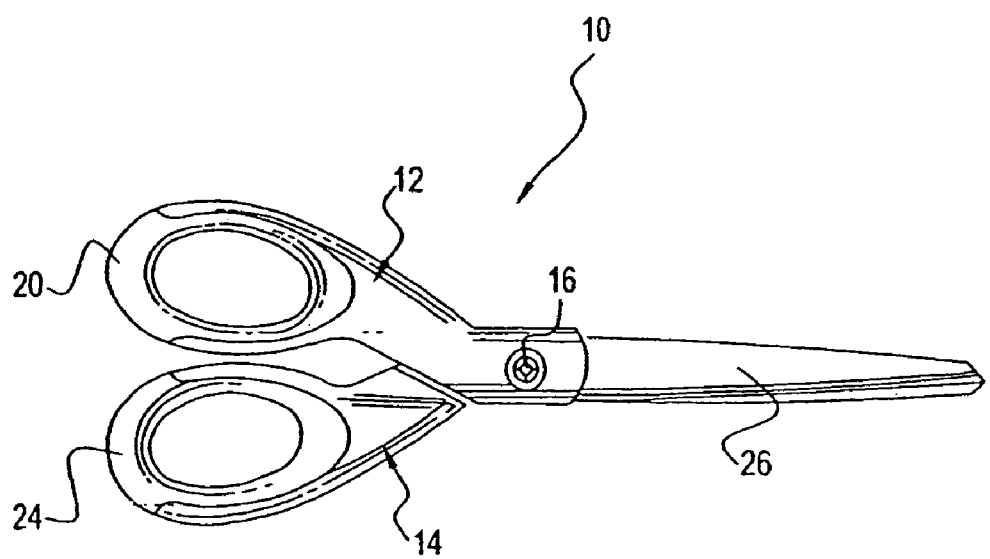
FIG. 2 is a second, opposite side view of the scissors of FIG. 1.

Referring now to the figures and in particular to FIGS. 1 and 2, a cutting implement in the form of a pair of scissors generally indicated by reference numeral 10 is illustrated.

Scissors 10 have a first half 12 pivotally connected to a second half 14. First and second halves 12, 14 are pivotally connected by conventional connection means, such as a screw 16 and a post 18. First half 12 can have a handle 20 and a blade 22. Similarly, second half 14 can have a handle 24 and a blade 26.

Each blade 22, 26 has a cutting edge 28. Preferably, cutting edge 28 is formed by way of a bevel 30 disposed on each blade 22, 26, respectively. Thus, scissors 10 provide a pair of complementary cutting blades 22, 26 for cutting stationery products, such as paper, cardboard, bristol board, and others.

Handles 20, 24 are preferably overmolded onto blades 22, 26, respectively. However, it should be recognized that each half 12, 14 of scissors 10 is described as having separate handles 20, 24 overmolded onto blades 22, 26, respectively.

Of course, it is contemplated by the present invention that each half 12, 14 have a unitary handle and blade portion.

Figure 3:
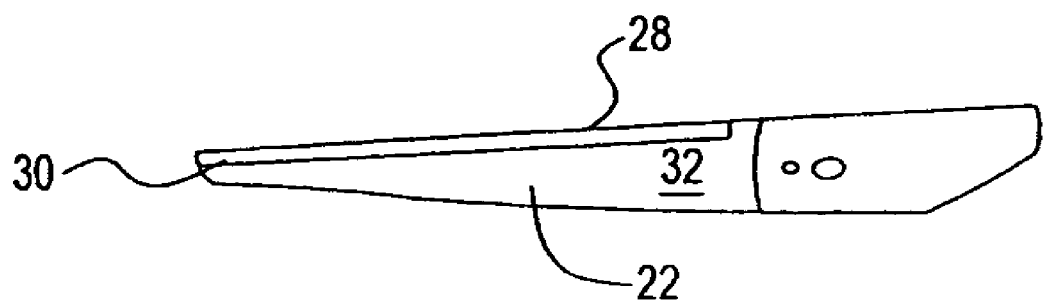
FIGS. 3 and 4 are side views of the blades of the scissors of FIG. 1.
Figure 4:
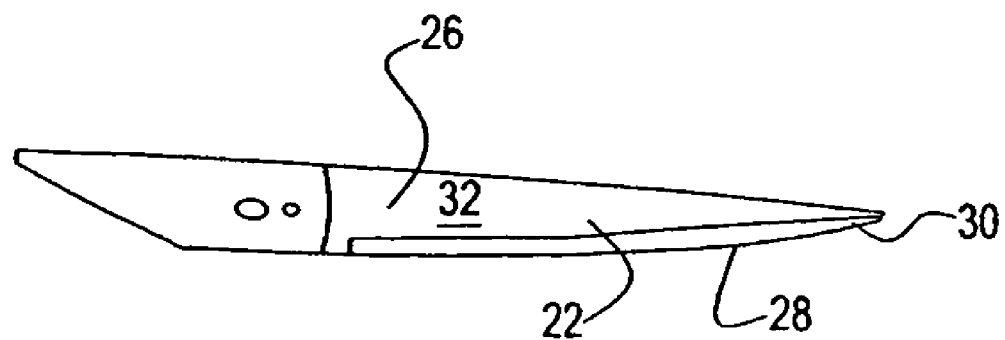

Blade 22 is illustrated in FIG. 3, while blade 26 is illustrated in FIG. 4. Blades 22, 26 are preferably made of steel, more preferably stainless steel, such as 420 stainless steel. In addition, blades 22, 26 can be heat-treated to further increase the hardness of the blades.

Scissors 10 further include a coating 32 disposed on each blade 22, 26. Coating 32 provides cutting edges 28 with extremely tough, hard, wear resistant characteristics. The increased hardness of cutting edges 28 provides scissors 10 with substantially increased longevity, while also providing the scissors with corrosion resistance, as well as providing a smooth and uniform appearance and color. For example, scissors 10 having coating 32 were subjected to cycle testing of 10,000 openings and closings without showing any signs of wear to the coating.

In addition, coating 32 provides scissors 10 with an aesthetically acceptable color or appearance. Specifically, coating 32 differentiates blades 22, 26 having coating 32 from uncoated blades. Coating 32 does not change the color of blades 22, 26 to the point that the consumer no longer recognizes scissors 10 as being useable for general household and office use. However, coating 32 has an appearance sufficient to allow the consumer to recognize that the coating is present on scissors 10.

Further, coating 32 increases the ease of use of scissors 10 by providing blades 22, 26 with a smooth surface finish, which reduces friction between the blades during use. Thus, blades 22, 26 have less friction between the two inside blade faces, and less friction between the blades 22, 26 and material to be cut (not shown), which provides a smoother cutting action and less cutting effort than in coated blades without coating 32.

Coating 32 is selected from the group consisting of titanium nitride (TiN), chromium nitride (CrN), and titanium chromium nitride (TiCrN). More preferably, coating 32 is a multiple component barrier of titanium chromium nitride.

Coating 32 is disposed on blades 22, 26 such that the coating forms a metallurgical bond with the blades, which resists flaking, blistering, chipping, and peeling. In fact, coating 32 is adsorbed into the surface layer of the metal of blades 22, 26. Coating 32 is disposed on blades 22, 26 with a thickness in a range between about 0.3 and 0.5 microns, more preferably about 0.4 microns.

FIG. 5 illustrates the test results for a range of compositions and processes for coating 32. Sample 1 is a control or uncoated blade formed of heat-treated 420 stainless steel. Heat-treated 420 stainless steel blades were also used in Samples 2 though 10.

In Samples 2 though 6, the blades were coated using a first process. Twelve (12) blades of each sample coating were prepared with a thickness of about 5.0 micrometers. In Samples 7 through 10, the blades were coated using a second process. All of the samples were then tested for surface smoothness, hardness, and color. The results of this testing are provided in FIG. 5.

The concentration of coating 32 in all samples were tested and were in the range of about +/−3 to 4 percent of the target composition. The testing also showed that both the elements are uniformly deposited and there is no segregation or isolation of each to any particular region in the film.

The first process was a reactive magnetron sputtering with a pulsed dc source. The second process comprised a cathode arc plasma (CAP) process. The sputtering gas mixture in each process was argon and nitrogen.

In the first process, a four-inch circular target is used with a pulsed dc power supply. The target was a combination target having one or more 90-degree sections of pure titanium and chromium. For example, in Sample #3 the target is three 90-degree sections of pure titanium and one 90-degree section of pure chromium.

In the second process, two different targets were used simultaneously, with each target being pure titanium and chromium.

The partial pressure of argon during the first process was maintained between 0 to 1 millitorr and that of nitrogen was maintained at 1 to 2 millitorr with the total sputtering gas pressure maintained between 2 to 3 millitorr. The stainless steel chamber was evacuated to $2 \times 10^{-5}$ Torr prior to the deposition. Cleaning of the target was carried with argon alone. The sputtering current was kept at 0.3 amps during cleaning that was carried out for 3 minutes in all depositions. Deposition of the films on the blades during cleaning was prevented by a shutter that was withdrawn soon after cleaning the target. The sputtering current was chosen at two different values, 0.5 amperes and 0.7 amperes. Depositions were performed for two different total sputtering times, 15 minutes and 30 minutes. The resulting thickness of the films was found to be 0.3 micrometers and 0.6 micrometers, respectively. The deposition temperature has been optimized for the following conditions. Stainless steel scissors blades should not soften and therefore deposition temperature was kept at a temperature of about 150° and 200° C.

The hardness of the samples was measured using a Vickers microhardness test according to the American Society of Testing and Materials (ASTM) E384, as revised March 2001. Here, a diamond indenter is loaded to a desired amount, which causes the indenter to indent the sample. The indentation is measured and converted to a hardness value. The indenter is a four-sided, pyramid-shaped diamond probe tip with angle of 136°. The hardness values of FIG. 5 represent the hardness of each sample with a load of about 50 grams, with a load of about 400 grams for the uncoated sample 1.

The results of FIG. 5 show that the coated samples (samples 2 to 10) are generally harder than the uncoated sample (sample 1). For example, sample 4 is about 125% harder than sample 1. Further, the results of FIG. 5 show that the hardness of the coated samples (samples 2 to 10) generally tends to increase as the content of chromium increases.

In addition, the results of FIG. 5 show that the silver appearance generally tends to increase as the content of chromium increases.

The samples having a majority of chromium (e.g., samples 6 and 10) had a gloss silver appearance, which was substantially similar to that of uncoated sample 1. In fact, it has been determined that consumers did not recognize that the scissors having a gloss silver appearance (e.g., the samples having a majority of chromium) had any coating at all.

In contrast, the samples having a majority of titanium (e.g., samples 2, 3, 7, and 8) had a satin gold appearance. Here, it has been determined that consumers recognized scissors having a satin gold appearance (e.g., the samples having a majority of titanium) as being for uses other than general household and office use. Namely, these scissors appear to the consumer to be specialty scissors.

However, the samples having a more balanced amount of titanium to chromium (e.g., samples 4, 5, and 9) had a satin silver appearance. Here, it has been determined that consumers recognized scissors 10 having a satin silver appearance as being for general household use and as having a coating.

Chromium is typically about 2.5 times more expensive than titanium. Thus, forming coating 32 of a majority of chromium leads to a substantial increase in cost, with only minimal gains in hardness. For example, coating 32 having 75% chromium and 25% titanium is about 95% as hard as a coating of 100% chromium.

It has also been found that the chromium nitride forms a strong bond to the blade, but does not form a strong bond with itself. For example, chromium nitride can form a strong bond with the chromium oxide of blades 22, 26, but does not form a strong bond with other chromium nitride molecules. Thus, the samples having a majority of chromium exhibited a higher tendency to peel than other samples having a minority of chromium.

The diffusion barrier properties exhibited by the samples having a majority of titanium were superior to those having less titanium. Thus, the samples having a majority of titanium exhibited better stain and corrosion resistance than other samples having a minority of titanium.

Coating 32 having the desired hardness, smoothness, and diffusion barrier properties preferably is formed of titanium chromium nitride having about 35 percent by weight of titanium nitride and about 65 percent by weight of chromium nitride and with a hardness in a range of about 5.7 to about 9.1 gigapascals. More preferably, coating 32 has about 50 percent by weight of titanium nitride and about 50 percent by weight of chromium nitride and a hardness in a range of about 7.2 to about 7.6 gigapascals.

It has been determined that coating 32 having the aforementioned ratios of chromium nitride and titanium nitride provided blades 22, 26 with a visual indication that the coating had been applied, without affecting the consumer's impression of the target use of the scissors (i.e., general household use). Moreover, coating 32 having the aforementioned ratios of chromium nitride and titanium nitride provided blades 22, 26 with drastically improved hardness over the uncoated sample 1.

The surface roughness of blades 22, 26 before and after the application of coating 32 was also measured. For example, the surface roughness of the outside surface of blades 22, 26 before coating 32 was in a range of about 20 to $25 \times 10^{-6}$ inch/inch, but was reduced to about 15 to $20 \times 10^{-6}$ inch/inch after the coating was applied. Similarly, the surface roughness of the inside surface of blades 22, 26 before coating 32 was about 25 to $30 \times 10^{-6}$ inch/inch, but was reduced to about 20 to $25 \times 10^{-6}$ inch/inch after the coating was applied. It is believed that the roughness of blades 22, 26 was reduced because the molecules of coating 32 predominantly bond with the valleys and indentations in the blades.

Of course, it should be recognized that scissors 10 are described above by way of example only as having a coating applied by reactive magnetron sputtering and CAP processes. Any thin film forming method such as chemical vapor deposition, physical vapor deposition, thermal spraying and sintering after a dip coating may be employed for providing coating 32 to blades 22, 26. Preferably, the method of forming coating 32 has a maximum temperature sufficient to not soften or affect the heat-treatment of the uncoated blades.

It should also be recognized that coating 32 has been described above by way of example only as finding use with a cutting implement in the form of blades 22, 26. Of course, coating 32 can provide the aforementioned benefits to other cutting implements. For example, FIGS. 6 to 12B illustrate alternate exemplary embodiments of cutting implements, which have a coating.

Figure 6:
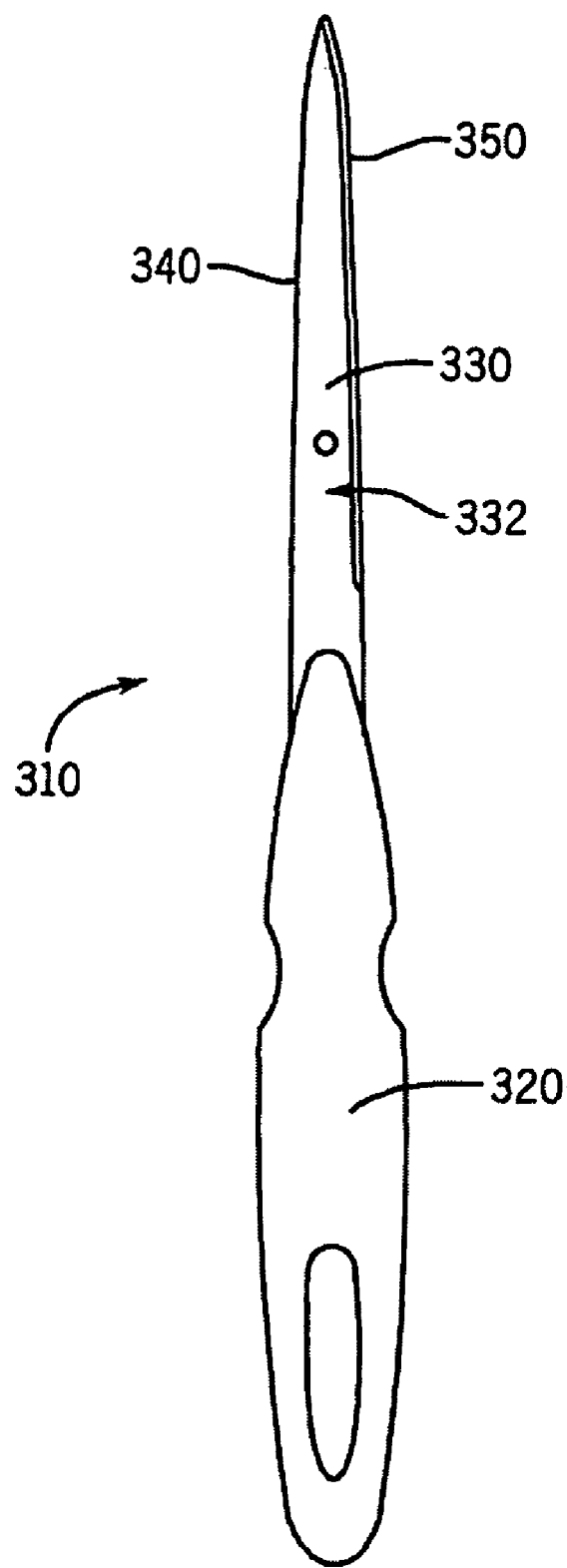
FIG. 6 is a side view of an exemplary embodiment of a letter opener according to the present invention.

One such exemplary embodiment of a cutting implement in the form of a letter opener 310 is illustrated in FIG. 6. Letter opener 310 is as shown in U.S. Design patent application Ser. No. 29/213,571 filed on Sep. 20, 2004, the contents of which are incorporated herein by reference.

Letter opener 310 has a grip 320 and a blade member 330. Blade member 330 has a pair of cutting edges 340, 350 that meet at a tip 360 opposite the grip 320.

During use of letter opener 310, the portion of an envelope (not shown) or other material to be cut is positioned against either cutting edge 340, 350. The user moves the letter opener 310 toward the portion of the material to be cut (not shown), so that a cutting edge 340, 350 severs the envelope.

Blade member 330 is preferably made of steel, more preferably stainless steel, such as 420 stainless steel. In addition, blade member 330 can be heat-treated to further increase the hardness of the blade member 330.

Letter opener 310 has a coating 332 disposed on blade member 330. As described in detail above with respect to the exemplary embodiments of FIGS. 1 to 5, coating 332 has a thickness in a range between about 0.3 microns and about 0.5 microns, more preferably about 0.4 microns.

Coating 332, like coating 32, provides the blade member 310 and cutting edges 340, 350 with extremely tough, hard, wear resistant characteristics. This increased hardness provides letter opener 310 with substantially increased longevity, while also providing the blade member 310 and cutting edges 340, 350 with corrosion resistance, as well as providing a smooth and uniform appearance and color. Coating 332 provides letter opener 310 with an aesthetically acceptable color or appearance and reduces friction between the blade member 330 and the material to be cut (not shown) during use.

Coating 332 can be made of titanium nitride (TiN), chromium nitride (CrN), or titanium chromium nitride (TiCrN). More preferably, coating 332 is a multiple component barrier of titanium chromium nitride.

For example, coating 332 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 332 may have about 50 percent by weight of titanium nitride and about 50 percent by weight of chromium nitride in a hardness in a range of about 7.2 to about 7.6 gigapascals, as measured by Vickers microhardness testing.

Figure 7:
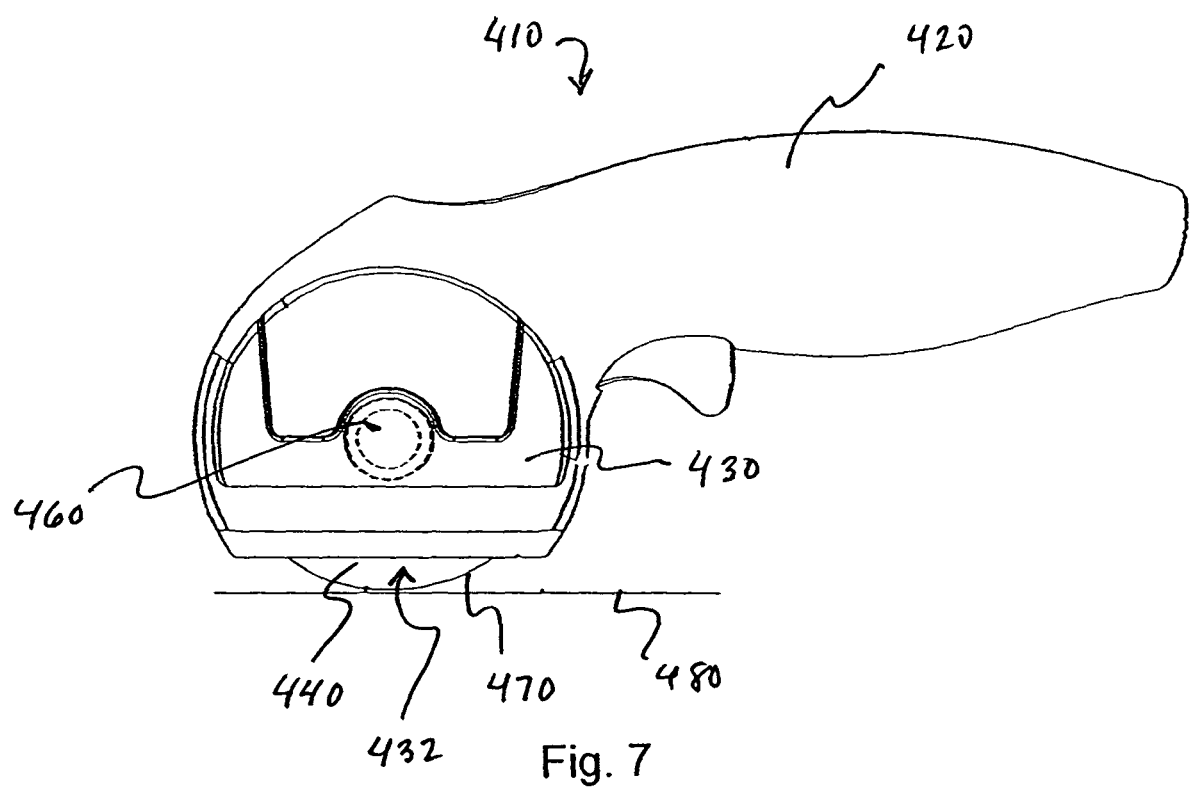
FIG. 7 is a side view of an exemplary embodiment of a handheld rotary trimmer according to the present invention.
Figure 8:
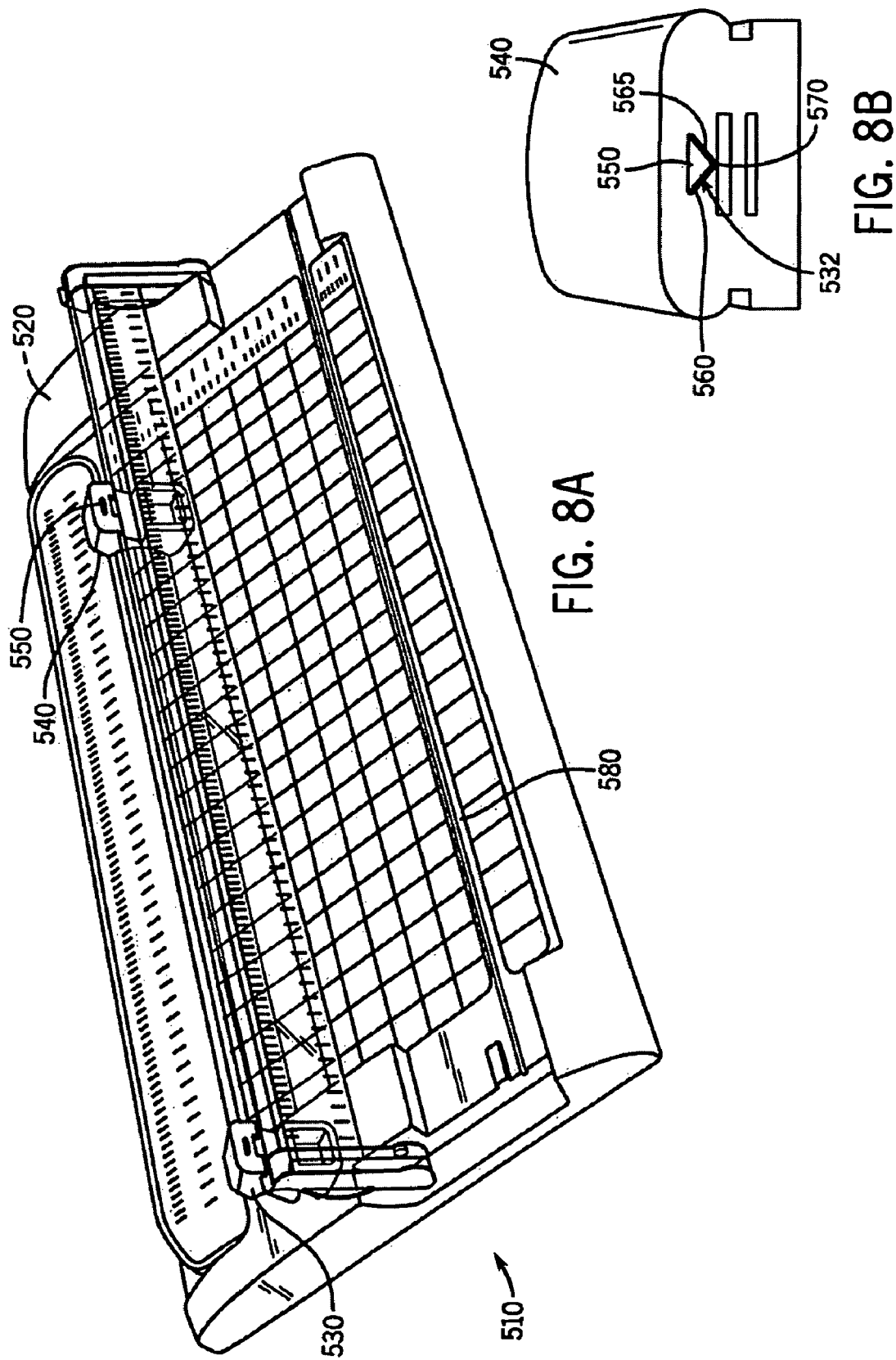
FIG. 8A is a perspective view of an exemplary embodiment of a sliding blade trimmer according to the present invention.
FIG. 8B is a perspective view of a blade carriage of the sliding blade trimmer of FIG. 8A.

Another exemplary embodiment of a cutting implement in the form of a handheld rotary trimmer 410 is illustrated in FIG. 7. Trimmer 410 is as shown and described in U.S. application Ser. No. 10/695,429 filed on Oct. 28, 2003, the contents of which are incorporated herein by reference.

Trimmer 410 has a grip 420 and a rotary cutting mechanism 430. Rotary cutting mechanism 430 has a circular cutting blade 440. Cutting blade 440 is slidably received on an axle 460. Blade 440 has a cutting edge 470 formed at its outer periphery. Blade also may have a blade guard 490.

During use of trimmer 410, a piece of material to be cut (not shown) is placed atop a self-healing mat 480 or other suitable complementary surface. The user holds the grip 420 and positions the trimmer 410 so that the cutting edge 470 contacts the material to be cut (not shown). The user applies downward pressure and moves the trimmer 410 in a direction generally parallel to the plane of circular cutting blade 440. The downward pressure and movement of the trimmer 410 causes the blade 440 to roll, its cutting edge 470 severing the material to be cut (not shown).

Blade 440 is preferably made of steel, more preferably stainless steel, such as 420 stainless steel. In addition, blade 440 can be heat-treated to further increase the hardness of the blade 420.

Trimmer 410 has a coating 432 disposed on blade 440. Again, coating 432 has a thickness in a range between about 0.3 microns and 0.5 microns, more preferably about 0.4 microns.

Coating 432, like coating 132, provides the cutting blade 440 with extremely tough, hard, wear resistant characteristics. This increased hardness provides trimmer 410 with substantially increased longevity, while also providing the trimmer with corrosion resistance, as well as providing a smooth and uniform appearance and color. Coating 432 provides trimmer 410 with an aesthetically acceptable color or appearance and reduces friction between the cutting blade 440 and material to be cut (not shown) and self-healing mat (not shown) during use.

Coating 432 can be made of titanium nitride (TiN), chromium nitride (CrN), or titanium chromium nitride (TiCrN). More preferably, coating 432 is a multiple component barrier of titanium chromium nitride.

For example, coating 432 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 432 may have about 50 percent by weight of titanium nitride and about 50 percent by weight of chromium nitride in a hardness in a range of about 7.2 to about 7.6 gigapascals, as measured by Vickers microhardness testing.

Another exemplary embodiment of a cutting implement in the form of a sliding blade trimmer 510 is illustrated in FIGS. 8A and 8B.

Trimmer 510 has a base 520, a pivoting rail 530, and a blade carriage 540. Blade carriage 540 houses a blade 550, with exposed cutting edges 560, 565 that meet at a tip 570 opposite the blade carriage 540. The plane of blade 550 is approximately parallel to the length of rail 530. Blade carriage 540 is slidably connected to pivoting rail 530. Pivoting rail 530 may be swung into an open, or inoperative position and a closed, or operative position. Base 520 has a blade-receiving groove 580 parallel to the rail 530 and positioned directly below the blade 550 when the rail is in the closed, or operative position.

During use of trimmer 510, a piece of material to be cut (not shown) is placed atop the base 520, under pivoting rail 530 and over the groove 580. When rail 530 is in a closed position, the user slides blade carriage 540 along the length of the rail 530. This sliding motion drives either cutting edge 560, 565 against the material to be cut (not shown), and cuts it in a line generally parallel to the length of rail 530.

Blade 550 is preferably made of steel, more preferably stainless steel, such as 420 stainless steel. In addition, blade 550 can be heat-treated to further increase the hardness of the blade 550.

Trimmer 510 has a coating 532 disposed on blade 550. Again, coating 532 has a thickness in a range between about 0.3 microns and 0.5 microns, more preferably about 0.4 microns.

Coating 532, like coating 32, provides the blade 550 with extremely tough, hard, wear resistant characteristics. This increased hardness provides trimmer 510 with substantially increased longevity, while also providing the trimmer 510 with corrosion resistance, as well as providing a smooth and uniform appearance and color. Coating 532 provides trimmer 510 with an aesthetically acceptable color or appearance and reduces friction between the cutting blade 550 and material to be cut (not shown).

Coating 532 can be made of titanium nitride (TiN), chromium nitride (CrN), or titanium chromium nitride (TiCrN). More preferably, coating 532 is a multiple component barrier of titanium chromium nitride.

For example, coating 532 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 532 may have about 50 percent by weight of titanium nitride and about 50 percent by weight of chromium nitride in a hardness in a range of about 7.2 to about 7.6 gigapascals, as measured by Vickers microhardness testing.

Figure 9:
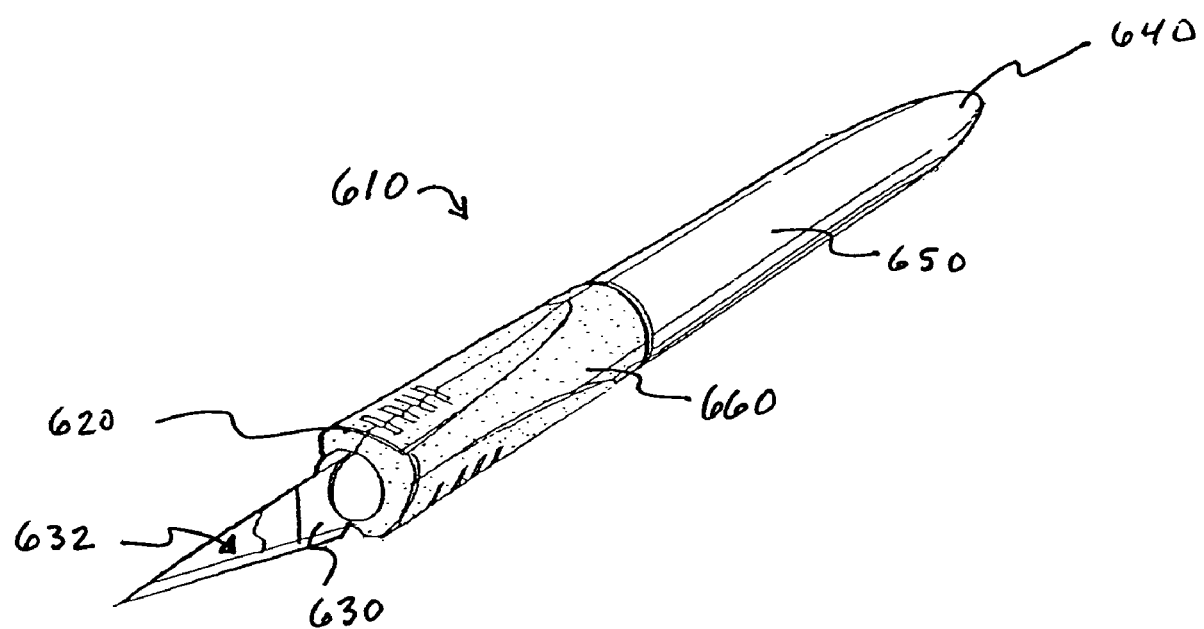
FIG. 9 is a perspective view of an exemplary embodiment of a hobby knife according to the present invention.

Another exemplary embodiment of a cutting implement in the form of a hobby knife 610 is illustrated in FIG. 9.

Hobby knife 610 has a first end 620 having a removable blade 630 and a second end 640 having a handle 650. Handle 630 may have a grip portion 640. Knife 610 may have a protective cap or blade guard 650, which attaches to the first end 620, covering the blade 630 and protecting the user from injury through accidental contact with the blade 630. Guard 650 also may attach to the second end 640, for convenient storage of the cap 650 while the hobby knife 610 is in use. Guard 650 may have a clip 660 for securing the hobby knife 610 to material such as a pocket on the user's clothing (not shown).

Blade 630 is preferably made of steel, more preferably stainless steel, such as 420 stainless steel. In addition, blade 630 can be heat-treated to further increase the hardness of the blade 630.

Hobby knife 610 has a coating 632 disposed on blade 630. Again, coating 632 has a thickness in a range between about 0.3 microns and 0.5 microns, more preferably about 0.4 microns.

Coating 632, like coating 32, provides the blade 630 with extremely tough, hard, wear resistant characteristics. This increased hardness provides hobby knife 610 with substantially increased longevity, while also providing the blade 630 with corrosion resistance, as well as providing a smooth and uniform appearance and color. Coating 632 provides knife 610 with an aesthetically acceptable color or appearance and reduces friction between the cutting blade 630 and material to be cut (not shown).

Coating 632 can be made of titanium nitride (TiN), chromium nitride (CrN), or titanium chromium nitride (TiCrN). More preferably, coating 632 is a multiple component barrier of titanium chromium nitride.

For example, coating 632 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 632 may have about 50 percent by weight of titanium nitride and about 50 percent by weight of chromium nitride in a hardness in a range of about 7.2 to about 7.6 gigapascals, as measured by Vickers microhardness testing.

Figure 10:
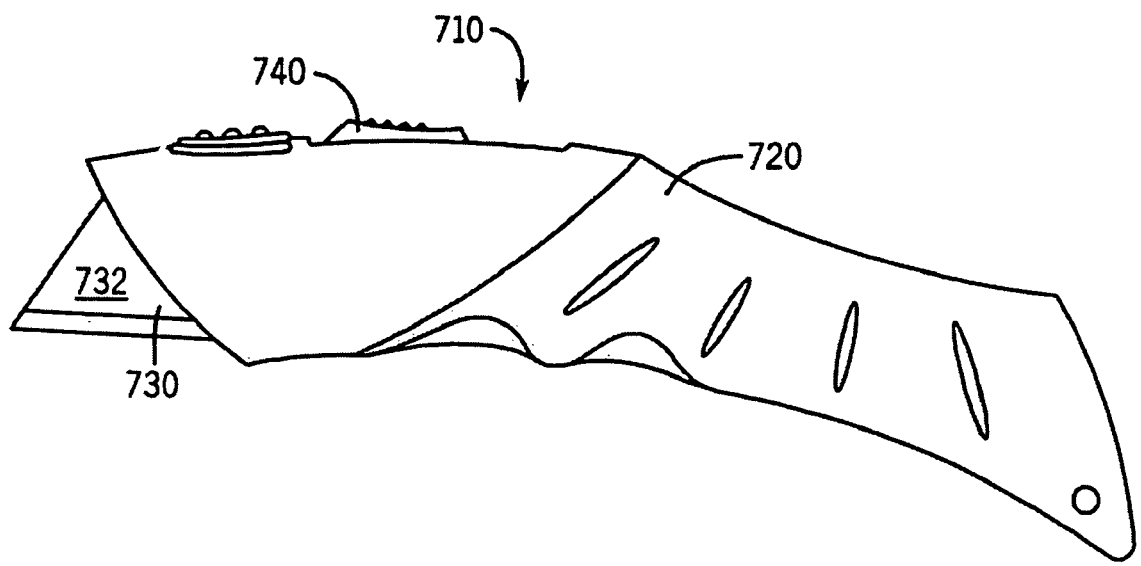
FIG. 10 is a side view of an exemplary embodiment of a utility knife according to the present invention.

Another exemplary embodiment of a cutting implement in the form of a utility knife 710 is illustrated in FIG. 10. Utility knife 710 has a handle 720 housing a retractable blade 730. Utility knife 710 has an actuating button 740 which is slidably operated by the user to expose the retractable blade 730 to an operative position as shown in FIG. 10 or withdraw the retractable blade 730 to an inoperative position (not shown).

Retractable blade 730 is preferably made of steel, more preferably stainless steel, such as 420 stainless steel. In addition, blade 730 can be heat-treated to further increase the hardness of the blade 730.

Utility knife 710 has a coating 732 disposed on blade 730. Again, coating 732 has a thickness in a range between about 0.3 microns and 0.5 microns, more preferably about 0.4 microns.

Coating 732 provides the blade 730 with extremely tough, hard, wear resistant characteristics. This increased hardness provides utility knife 710 with substantially increased longevity, while also providing the blade 730 with corrosion resistance, as well as providing a smooth and uniform appearance and color. Coating 732 provides knife 710 with an aesthetically acceptable color or appearance and reduces friction between the cutting blade 730 and material to be cut (not shown).

Coating 732 can be made of titanium nitride (TiN), chromium nitride (CrN), or titanium chromium nitride (TiCrN). More preferably, coating 732 is a multiple component barrier of titanium chromium nitride.

For example, coating 732 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 732 may have about 50 percent by weight of titanium nitride and about 50 percent by weight of chromium nitride in a hardness in a range of about 7.2 to about 7.6 gigapascals, as measured by Vickers microhardness testing.

Figure 11:
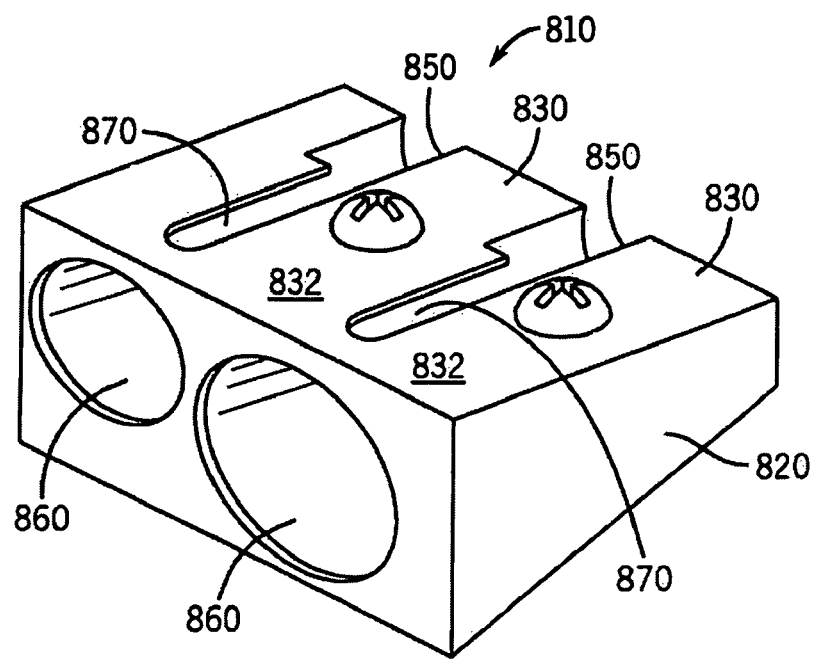
FIG. 11 is a perspective view of an exemplary embodiment of a pencil sharpener according to the present invention.

Another exemplary embodiment of a cutting implement in the form of a pencil sharpener 810 is illustrated in FIG. 11. Pencil sharpener 810 has a housing 820 containing at least one blade 830 having a cutting edge 850. Housing 820 has a generally conical chamber 840 for receiving a pencil (not shown) or other utensil for sharpening. Chamber 840 has a narrow longitudinal opening 870 along the length of chamber 840. Blade 830 is affixed to chamber 840 adjacent the opening 870 such that cutting edge 850 extends slightly into opening, allowing cutting edge 850 to contact utensil (not shown) when utensil (not shown) is inserted into the chamber 840.

A user may operate sharpener 810 by inserting a utensil (not shown) into chamber 840 and rotating the utensil (not shown) within the chamber 840 such that blade 830 cuts the utensil into a conical shape generally corresponding to the shape of chamber 840, thereby sharpening an end of the utensil. Alternatively, sharpener 810 may be equipped with an automatic means of rotating the blade 830 and chamber 840 around the utensil, such as a battery-operated motor (not shown).

Blade 830 is preferably made of steel, more preferably stainless steel, such as 420 stainless steel. In addition, blade 830 can be heat-treated to further increase the hardness of the blade 830.

Pencil sharpener 810 has a coating 832 disposed on at least one blade 830. Again, coating 832 has a thickness in a range between about 0.3 microns and 0.5 microns, more preferably about 0.4 microns.

Coating 832 provides the blade 830 with extremely tough, hard, wear resistant characteristics. This increased hardness provides pencil sharpener 810 with substantially increased longevity, while also providing the blade 830 with corrosion resistance, as well as providing a smooth and uniform appearance and color. Coating 832 provides pencil sharpener 810 with an aesthetically acceptable color or appearance and reduces friction between the cutting blade 830 and utensil to be sharpened (not shown). Reduced friction, for example, between the blade 830 and a pencil (not shown) enhances the performance of the pencil sharpener 810 by reducing the user effort required to operate the sharpener 810. Reduced friction, for example, between the blade 830 and pencil shavings (not shown), also enhances the performance of pencil sharpener 810 by allowing shavings (not shown) to fall or otherwise be more easily removed from blade 830 than from an uncoated blade.

Coating 832 can be made of titanium nitride (TiN), chromium nitride (CrN), or titanium chromium nitride (TiCrN). More preferably, coating 832 is a multiple component barrier of titanium chromium nitride.

For example, coating 832 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 832 may have about 50 percent by weight of titanium nitride and about 50 percent by weight of chromium nitride in a hardness in a range of about 7.2 to about 7.6 gigapascals, as measured by Vickers microhardness testing.

Figure 12A:
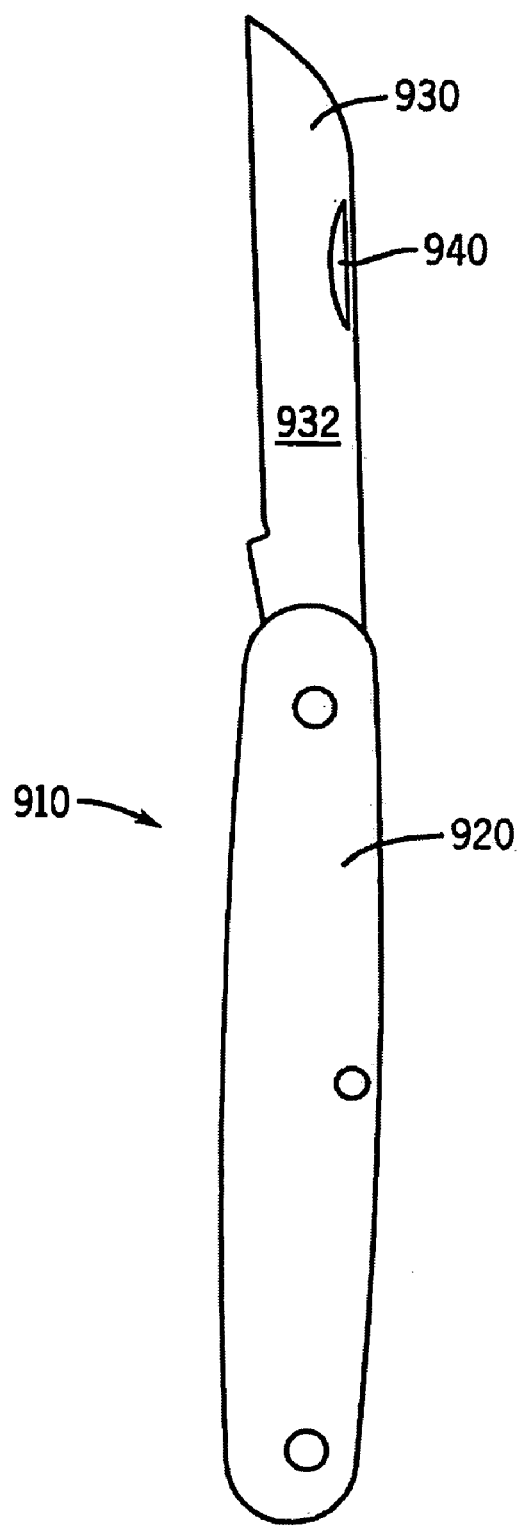
FIG. 12A is a side view of an exemplary embodiment of a pocket knife according to the present invention in an open position.
Figure 12B:
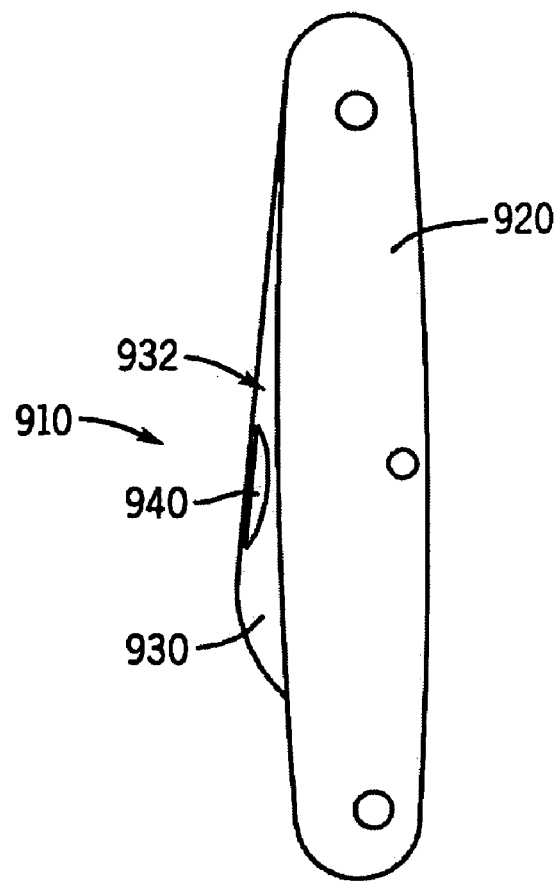
FIG. 12B is a side view of the pocket knife of FIG. 12A in a closed position.

Another exemplary embodiment of a cutting implement in the form of a pocket knife 910 is illustrated in FIGS. 12A and 12B. Pocket knife 910 has a handle 920 housing a hinged blade 930. Housing 920 contains at least one chamber (not shown) for receiving the hinged blade 930 in a closed or inoperative position as shown in FIG. 12A. Hinged blade 930 may have a notch or groove 940 for use in swinging the blade 930 into an open or operative position as shown in FIG. 12B.

Hinged blade 930 is preferably made of steel, more preferably stainless steel, such as 420 stainless steel. In addition, blade 930 can be heat-treated to further increase the hardness of the blade 930.

Pocket knife 910 has a coating 932 disposed on hinged blade 930. Once again, coating 932 has a thickness in a range between about 0.3 microns and 0.5 microns, more preferably about 0.4 microns.

Coating 932 provides the blade 930 with extremely tough, hard, wear resistant characteristics. This increased hardness provides pocket knife 910 with substantially increased longevity, while also providing the blade 930 with corrosion resistance, as well as providing a smooth and uniform appearance and color. Coating 932 provides knife 910 with an aesthetically acceptable color or appearance and reduces friction between the cutting blade 930 and material to be cut (not shown).

Coating 932 can be made of titanium nitride (TiN), chromium nitride (CrN), or titanium chromium nitride (TiCrN). More preferably, coating 932 is a multiple component barrier of titanium chromium nitride.

For example, coating 932 may be formed of titanium chromium nitride having about 35 percent by weight of titanium nitride and about 65 percent by weight of chromium nitride and with a hardness in a range of about 5.7 to about 9.1 gigapascals, as measured by Vickers microhardness testing. Alternatively, coating 932 may have about 50 percent by weight of titanium nitride and about 50 percent by weight of chromium nitride in a hardness in a range of about 7.2 to about 7.6 gigapascals, as measured by Vickers microhardness testing.

The coating described herein for cutting implements provides a cost competitive manner to improve the hardness, longevity, stain resistance, and ease of use of the cutting implement. For example, it has been found that the coating of the present invention, when applied using the aforementioned CAP process, increases the cost of the cutting implement by about seventeen cents, or less than 30% of the cost of manufacture the implement.

It should also be noted that the terms "first," "second," and "third" and the like may be used herein to modify various elements. These modifiers do not imply a spatial, sequential, or hierarchical order to the modified elements unless specifically stated.

While the invention has been described with reference to one or more exemplary embodiments, it will be understood by those skilled in the art that various changes may be made and equivalents may be substituted for elements thereof without departing from the scope of the invention. In addition, many modifications may be made to adapt a particular situation or material to the teachings of the disclosure without departing from the essential scope thereof. Therefore, it is intended that the invention not be limited to the particular embodiment(s) disclosed as the best mode contemplated for carrying out this invention, but that the invention will include all embodiments falling within the scope of the appended claims.

What is claimed is:

1. A cutting implement comprising:
a cutting blade; and
a coating disposed on said cutting blade, the coating comprising about 10% by weight to about 50% by weight titanium nitride and about 50% by weight to about 90% by weight chromium nitride, wherein the titanium nitride and the chromium nitride are not isolated in different regions of the coating, wherein the cutting implement is selected from the group consisting of scissors a letter opener, a handheld rotary trimmer, a sliding blade paper trimmer, a knife, and a pencil sharpener, and wherein the coating consists essentially of nitrides of titanium and chromium.

2. The cutting implement according to claim 1, wherein said coating has a thickness of about 0.4 microns.

3. The cutting implement as in claim 1, wherein said coating provides said cutting blade with a surface roughness in a range of about 15 to 25×10$^{-6}$ inch/inch.

4. The cutting implement as in claim 1, wherein the cutting blade is formed of a material selected from the group consisting of steel, stainless steel, 420 stainless steel, heat-treated steel, heat-treated stainless steel, and heat-treated 420 stainless steel.

5. The cutting implement as in claim 1, wherein said coating is disposed on the cutting blade such that the coating forms a metallurgical bond with the blade, said metallurgical bond resisting flaking, blistering, chipping, and peeling.

6. The cutting implement as in claim 1, wherein said coating is adsorbed into a surface layer of the cutting blade.

7. The cutting implement as in claim 1 further comprises at least one of a handle and a blade guard.

8. The cutting implement as in claim 1, wherein the nitrides of titanium and chromium include titanium chromium nitride.

9. The cutting implement as in claim 1, wherein the coating has a thickness in the range of about 0.3 to 0.5 microns.

10. A cutting implement comprising:
a cutting blade; and
a coating disposed on the cutting blade, the coating comprising about 35% by weight to about 90% by weight chromium nitride, and about 10% by weight to about 65% by weight titanium nitride, wherein the titanium nitride and the chromium nitride are not isolated in different regions of the coating, and the coating consisting essentially of nitrides of titanium and chromium.

11. The cutting implement as in claim 10, wherein said coating comprises about 35 percent by weight of titanium nitride and about 65 percent by weight of chromium nitride.

12. The cutting implement as in claim 11, wherein the cutting implement is selected from the group consisting of a letter opener, a handheld rotary trimmer, a sliding blade paper trimmer, a knife, and a pencil sharpener.

13. The cutting implement as in claim 10, wherein said coating comprises about 50 percent by weight of titanium nitride and about 50 percent by weight of chromium nitride.

14. The cutting implement as in claim 10, wherein said coating has a thickness of about 0.3 to 0.5 microns.

15. The cutting implement as in claim 10, wherein said coating has a surface roughness in a range of about 15 to 25×10$^{-6}$ inch/inch.

16. The cutting implement as in claim 10, wherein said coating provides the cutting blade with a satin silver appearance.

17. The cutting implement as in claim 16, wherein the cutting implement is selected from the group consisting of a letter opener, a handheld rotary trimmer, a sliding blade paper trimmer, a knife, and a pencil sharpener.

18. The cutting implement as in claim 10, wherein said cutting blade is formed of a material selected from the group consisting of steel, stainless steel, 420 stainless steel, heat-treated steel, heat treated stainless steel, and heat treated 420 stainless steel.

19. The cutting implement as in claim 10, wherein the cutting implement is selected from the group consisting of a letter opener, a handheld rotary trimmer, a sliding blade paper trimmer, a knife, and a pencil sharpener.

20. The cutting implement as in claim 10, wherein the cutting implement) is selected from the group consisting of a hobby knife, a utility knife, and a pocket knife.

21. A cutting implement comprising:
a cutting blade; and
a coating disposed on said cutting blade providing the cutting blade with a satin silver appearance, the coating comprising about 10% by weight to about 50% by weight titanium nitride and about 50% by weight to about 90% by weight chromium nitride, and forming a metallurgical bond with the blade that is resistant to flaking, blistering, chipping, and peeling,
wherein the titanium nitride and the chromium nitride are not isolated in different regions of the coating, and the cutting implement is selected from the group consisting of scissors, a letter opener, a handheld rotary trimmer, a sliding blade paper trimmer, a knife, and a pencil sharpener, and wherein the coating consists essentially of nitrides of titanium and chromium.

* * * * *

UNITED STATES PATENT AND TRADEMARK OFFICE
CERTIFICATE OF CORRECTION

PATENT NO. : 7,913,402 B2  
APPLICATION NO. : 11/231151  
DATED : March 29, 2011  
INVENTOR(S) : Buchtmann et al.

Page 1 of 1

It is certified that error appears in the above-identified patent and that said Letters Patent is hereby corrected as shown below:

Column 11:

Line 33, after "scissors" insert --,--.

Column 12:

Line 41, after "implement" delete ")".

Signed and Sealed this  
Fourteenth Day of June, 2011

David J. Kappos  
*Director of the United States Patent and Trademark Office*